United States Patent
Jain et al.

(10) Patent No.: US 12,327,586 B2
(45) Date of Patent: *Jun. 10, 2025

(54) BIT LINE PRE-CHARGE CIRCUIT FOR POWER MANAGEMENT MODES IN MULTI BANK SRAM

(71) Applicant: Taiwan Semiconductor Manufacturing Company, Ltd., Hsinchu (TW)

(72) Inventors: Sanjeev Kumar Jain, Ottawa (CA); Ruchin Jain, Hsinchu (TW); Arun Achyuthan, Stittsville (CA); Atul Katoch, Kanata (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/585,184

(22) Filed: Feb. 23, 2024

(65) Prior Publication Data

US 2024/0242762 A1 Jul. 18, 2024

Related U.S. Application Data

(63) Continuation of application No. 18/188,523, filed on Mar. 23, 2023, now Pat. No. 11,935,589, which is a
(Continued)

(51) Int. Cl.
*G11C 11/00* (2006.01)
*G11C 7/10* (2006.01)
(Continued)

(52) U.S. Cl.
CPC .......... *G11C 11/419* (2013.01); *G11C 7/1093* (2013.01); *G11C 7/12* (2013.01); *G11C 2207/12* (2013.01)

(58) Field of Classification Search
CPC ....... G11C 11/419; G11C 7/1093; G11C 7/12; G11C 2207/12

See application file for complete search history.

(56) References Cited

U.S. PATENT DOCUMENTS 6,591,353 B1  7/2003  Barth et al.
6,980,481 B1  12/2005  Brown
(Continued)

FOREIGN PATENT DOCUMENTS

| CN | 1725372 A | 1/2006 |
| TW | I541971 | 7/2016 |
| TW | I594237 | 8/2017 |

OTHER PUBLICATIONS

Taiwanese Office Action, Application No. 110135980, dated Jun. 21, 2022.
(Continued)

*Primary Examiner* — Pho M Luu
(74) *Attorney, Agent, or Firm* — Jones Day

(57) ABSTRACT

Systems and methods are provided for controlling a wake-up operation of a memory circuit. The memory circuit is configured to precharge the bit lines of a memory array sequentially during wakeup. A sleep signal is received by the first bit line of a memory cell and then a designed delay occurs prior to the precharge of a second complementary bit line. The sleep signal may then precharge the bit lines of a second memory cell with further delay between the precharge of each bit line. The memory circuit is configured to precharge both bit lines of a memory cell at the same time when an operation associated with that cell is designated.

20 Claims, 11 Drawing Sheets

Related U.S. Application Data continuation of application No. 17/246,822, filed on May 3, 2021, now Pat. No. 11,626,158.

(60) Provisional application No. 63/106,400, filed on Oct. 28, 2020.

(51) Int. Cl.
*G11C 7/12* (2006.01)
*G11C 11/419* (2006.01)

(56) References Cited

U.S. PATENT DOCUMENTS

| | | | |
|---|---|---|---|
| 7,193,921 B2 * | 3/2007 | Choi | G11C 7/22 |
| | | | 365/194 |
| 9,087,564 B2 | 7/2015 | Ashizawa | |
| 9,685,224 B2 * | 6/2017 | Yang | G11C 11/417 |
| 10,170,181 B2 * | 1/2019 | Jo | G11C 13/0004 |
| 11,626,158 B2 * | 4/2023 | Jain | G11C 5/148 |
| | | | 365/203 |
| 11,935,589 B2 * | 3/2024 | Jain | G11C 11/417 |
| 2005/0286322 A1 | 12/2005 | Choi et al. | |
| 2007/0189086 A1 | 8/2007 | Choi et al. | |
| 2017/0256292 A1 | 9/2017 | McCombs | |

OTHER PUBLICATIONS

Korean Office Action, Application No. 10-2021-0083163, dated Nov. 7, 2022.
Chinese Office Action; Application No. 202111199397.8; Dated Apr. 19, 2025.

* cited by examiner

| Input | Output |
|---|---|
| 0 | 0 |
| 1 | 1 |

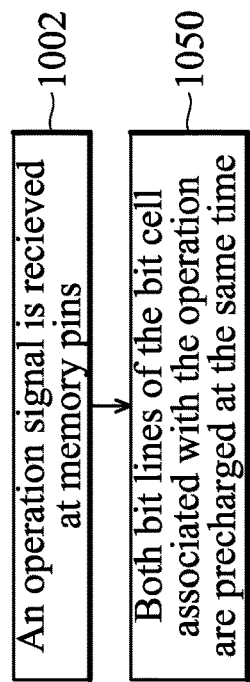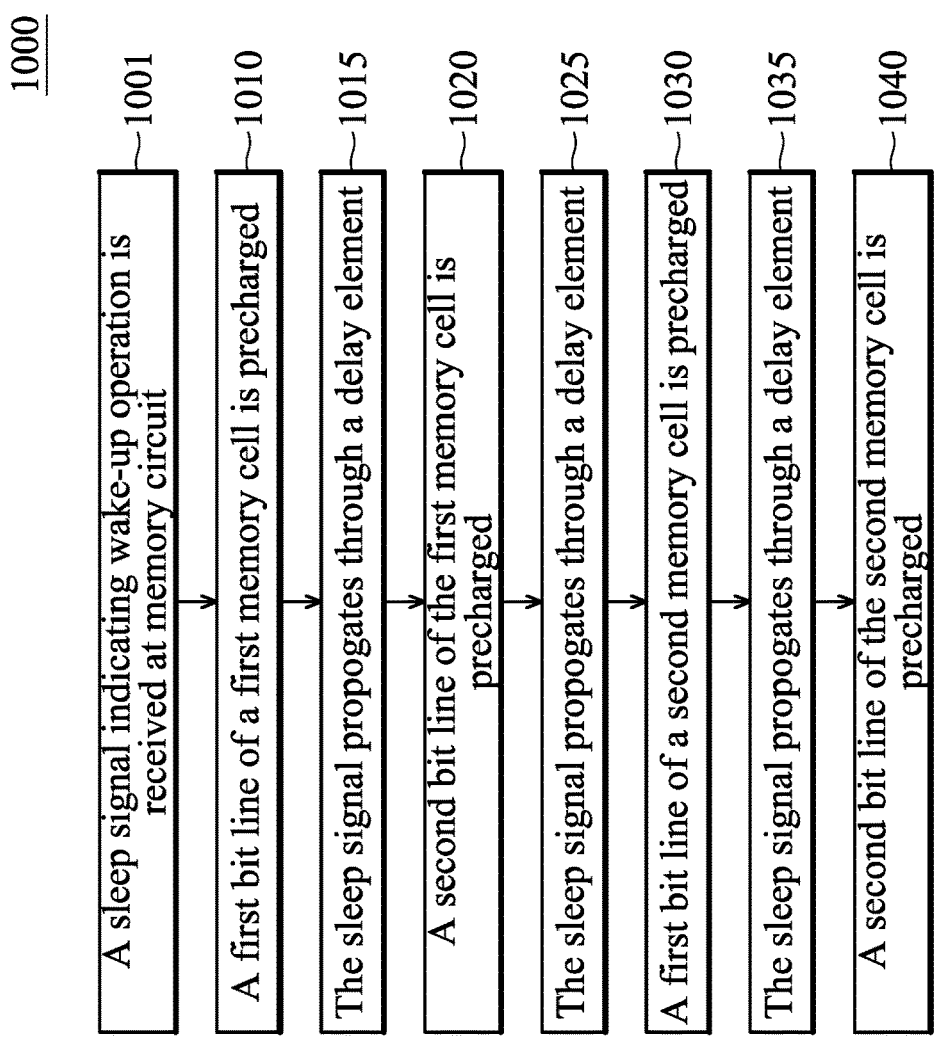

BIT LINE PRE-CHARGE CIRCUIT FOR POWER MANAGEMENT MODES IN MULTI BANK SRAM

CROSS-REFERENCE TO RELATED APPLICATIONS

This application is a continuation of U.S. patent application Ser. No. 18/188,523, filed on Mar. 23, 2023, now U.S. Pat. No. 11,935,589, which is a continuation of U.S. patent application Ser. No. 17/246,822, filed on May 3, 2021, entitled "Bit Line Pre-charge Circuit for Power Management Modes in Multi Bank SRAM, now U.S. Pat. No. 11,626,158, issued on Apr. 11, 2023, which claims priority to U.S. Provisional Application No. 63/106,400, filed on Oct. 28, 2020, entitled "Bit Line Precharge Circuit" each of which is incorporated herein by reference in their entirety.

TECHNICAL FIELD

The technology described in this patent document relates generally to semiconductor memory systems, and more particularly to power management systems and methods for a semiconductor memory system.

BACKGROUND

A memory bank is a logical unit of storage. A memory bank typically includes multiple rows and columns of storage units (memory cells). Sleep signals are routed to memory banks to precharge bit cells for wake-up or operations. A wake-up signal may be generated which has associated power costs to prepare memory cells for operation after a low power or sleep state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A-10B are flow diagrams of an example method for controlling a wake-up operation for a memory array in an embodiment.

DETAILED DESCRIPTION

Figure 1:
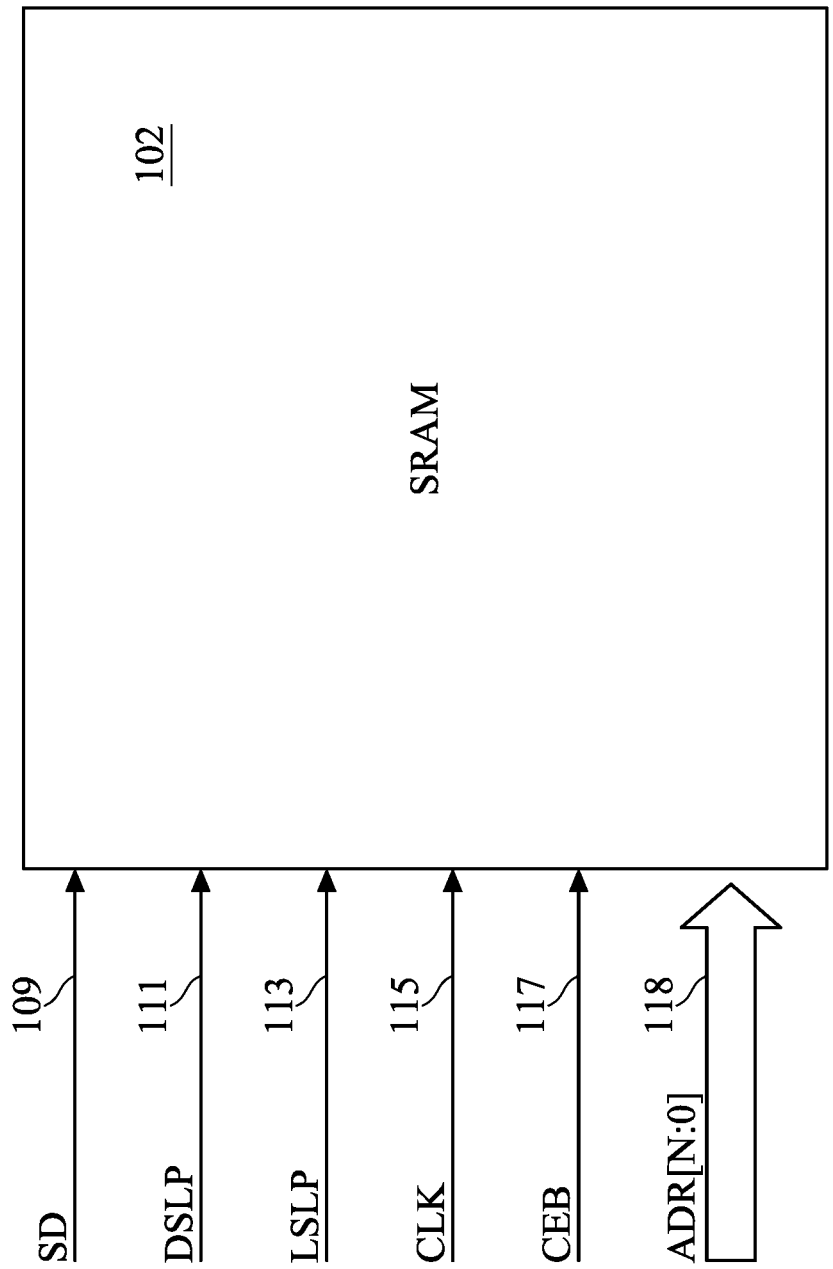
FIG. 1 is a diagram depicting a memory circuit that is configured to receive sleep and wake-up commands in an embodiment.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Power gates are often used to turn off periphery and memory array in a low power SRAM. When memory comes out of a sleep mode (e.g., shut-down, deep sleep, and light sleep), large power gates may be used to ramp up the internal supply voltage of the memory. Power gates that provide a short wake-up time for the internal supply voltage may lead to large in-rush current. Large in-rush current may be sub-optimal because it can cause component failure and excess power draw in constrained devices.

The word line internal power supply and bit line pre-charge circuit of a memory system may be turned off during light sleep mode. Memory design criteria might suggest maintaining a wake-up peak current that is smaller than the mission mode (R/W operation) peak current, particularly during light sleep mode. A design might fail to meet this criteria during light sleep wake-up where bit lines are pre-charged at almost the same time within a memory bank.

Sequential wakeup is a technique that could be used to reduce wake-up peak current in a memory system. But it may be difficult to match the bit line pre-charge signal and sleep signal delay across all memory macros and PVTs. Without careful management, multiple bit lines could be pre-charged at substantially the same time, resulting in undesirable peak current levels being realized.

Systems and methods for power management in a memory system are described herein. In embodiments, a delay element (such as a pair of inverters) is utilized in a semiconductor memory system (e.g., SRAM) to track the bit line pre-charge signal in order to reduce peak current when coming out of power management mode (e.g., shut-down, deep sleep, and light sleep). In this way, a sequential bit line pre-charge operation within a memory bank may be achieved, and consequentially, wake-up peak current may be reduced to prevent high peak power draw which may cause component failures in constrained devices. Wake-up peak current may cause component failures when it is greater than mission mode peak current.

FIG. 1 is a diagram depicting a memory circuit that is configured to receive sleep and array signals in an embodiment. The example SRAM memory 102 includes a plurality of input pins configured to receive sleep and addressing signals. In the example of FIG. 1, the memory 102 is configured to receive a clock (CLK) 115, a chip enable (CEB) signal 117, a shut-down mode (SD) signal 109, a deep sleep mode (DSLP) signal 111, and a light sleep mode (LSLP) signal 113. The SRAM memory 102 is further configured to receive an address input (ADR[N:0]) 118. In embodiments, the address received at the address input indicates an address in the memory bank. The memory bank is made up of two or more memory arrays.

Figure 2:
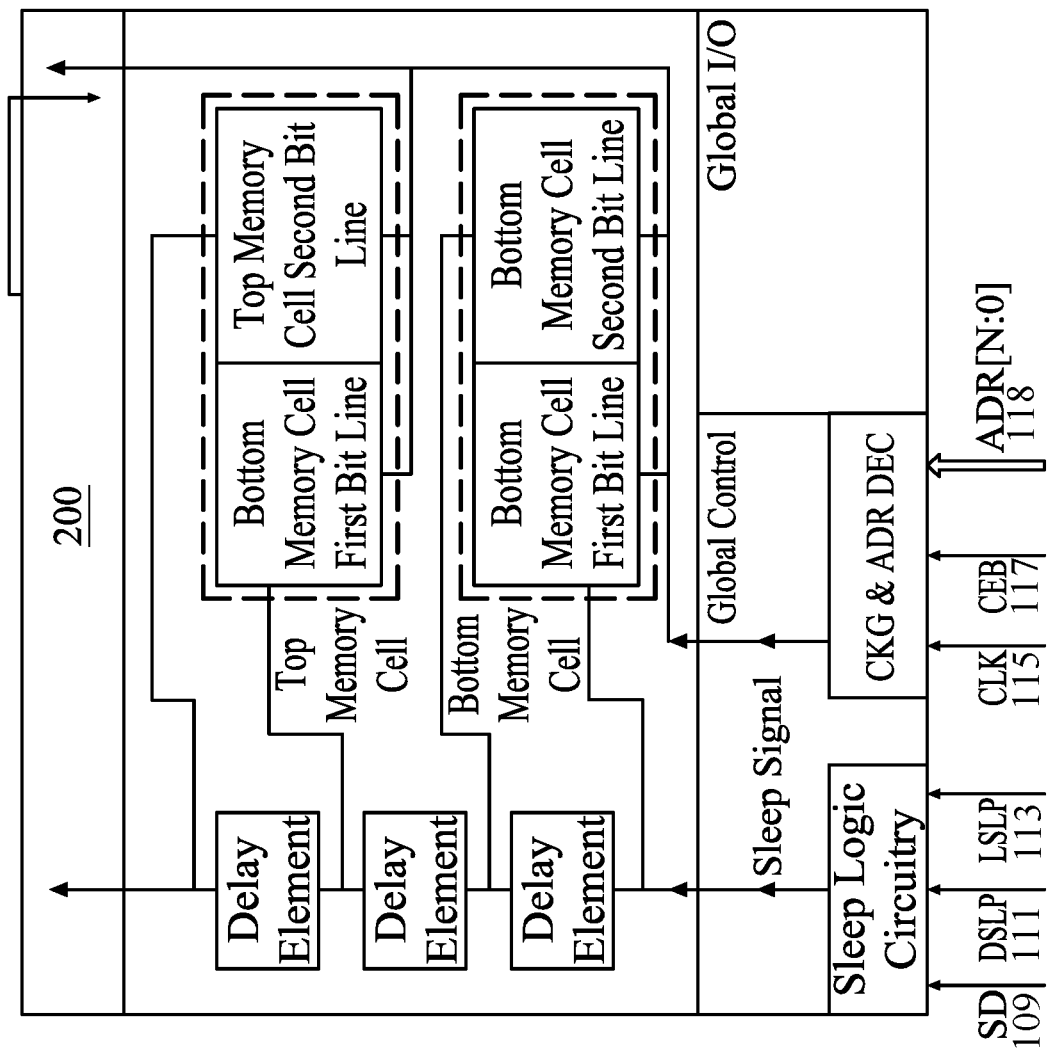
FIG. 2 is a block diagram depicting a memory architecture that includes sleep signal and delay elements in accordance with an embodiment.

FIG. 2 is a block diagram depicting a bit line precharge circuit 200 that includes a sleep signal with sequential delay elements in accordance with an embodiment. The example SRAM memory circuit includes a memory array with two memory cells a first (bottom) memory cell and a second (top) memory cell. The bottom memory cell including a first bit line and a second complementary bit line. The top memory cell includes a first bit line and a second complementary bit line. The second bit line is also called a bit line bar. The memory circuit further includes a global control within the global input/output. The global control includes sleep logic circuitry and a clock generator and address decoder. The sleep logic circuitry has input pins for the shut-down mode (SD) signal 109, a deep sleep mode (DSLP) signal 111, and a light sleep mode (LSLP) signal 113. The clock generator and decoder has input pins for a clock (CLK) signal 115, a chip enable (CEB) signal 117, and the address input (ADR[N:0]) 118. The sleep logic circuitry is configured to generate a sleep signal (SLP) if a shut down (SD) signal 109, deep sleep mode (DSLP) signal 111, or light sleep mode (LSLP) signal 113 is present. The sleep signal or wake-up signal path includes a plurality of delay elements configured in series. The sleep signal is configured to precharge each of the bit lines sequentially with a delay element between each connection between the wake-up signal path and the bit line.

Figure 3:
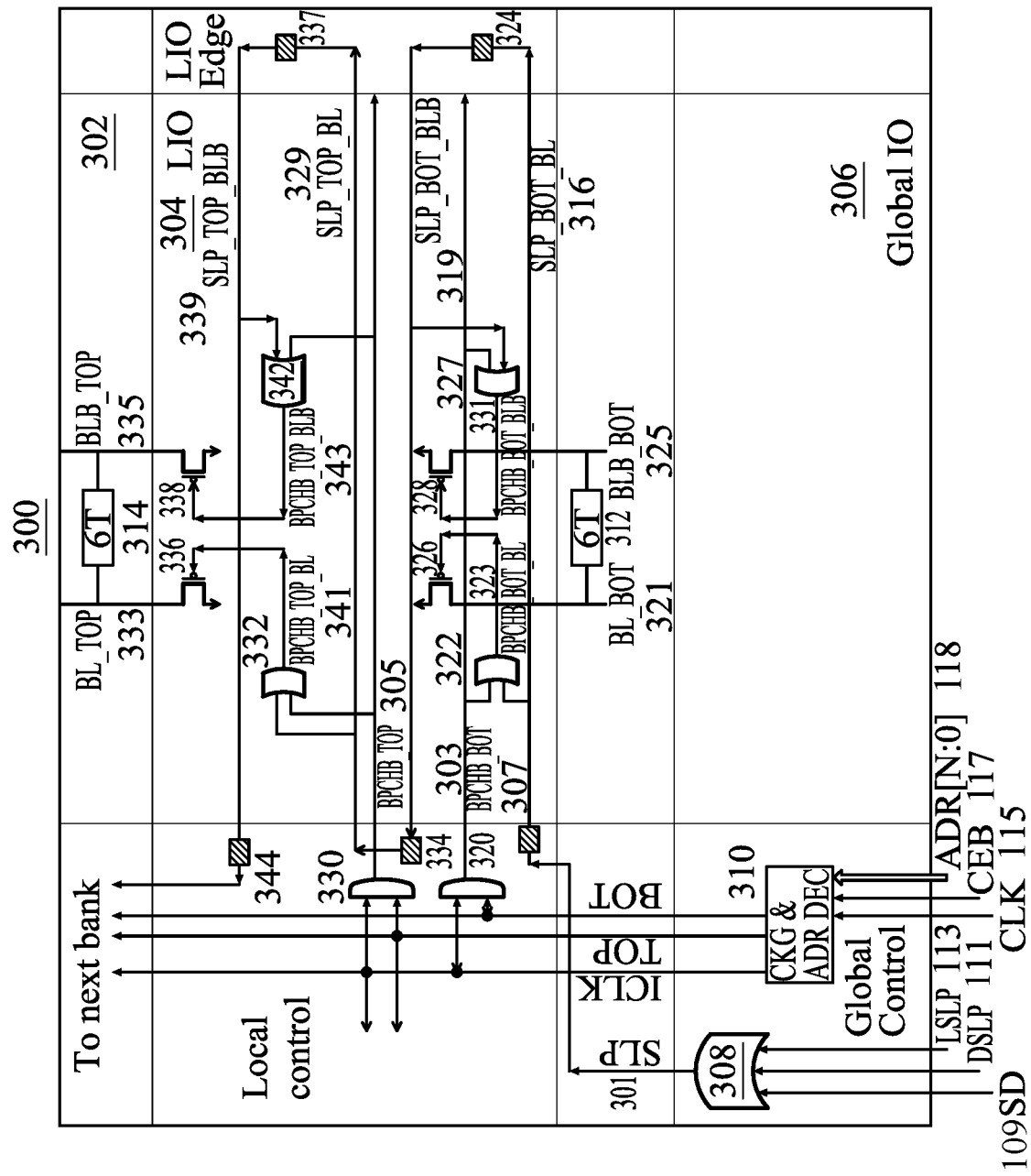
FIG. 3 is a diagram of an example power management circuit for a semiconductor memory (e.g., SRAM) in an embodiment.

FIG. 3 is a diagram of an example power management circuit 300 for a semiconductor memory (e.g., SRAM) in accordance with an embodiment. The power management circuit 300 is an example embodiment of the bit line precharge circuit 200 as diagramed in FIG. 2. The example power management circuit 300 includes a memory array 302 having a plurality of memory cells that are controlled by a local input/output (I/O) system 304 and a global I/O system 306. The global I/O system 306 includes logic circuitry 308 that generates a sleep signal 301 (SLP), and a clock generator and address decoder 310 that generates clock (ICLK) and addressing signals (TOP, BOT) for selecting a memory cell in the memory array 302 for read or write operations. Specifically, in the illustrated embodiment, the global I/O system 306 includes the logic (OR) gate 308 that generates the sleep signal 301 (SLP) as a function of power management signals that include a shut-down mode (SD) signal 109, a deep sleep mode (DSLP) signal 111, and a light sleep mode (LSLP) signal 113. These three modes (SD, DSLP and LSLP) control power management for the memory system. For example, in light sleep mode, the bit line pre charge circuit and word line drivers may be turned off, in deep sleep mode, the memory logic may be turned off, and in shut-down mode, the entire memory circuit may be turned off. The clock generator and address decoder 310, in the illustrated embodiment, generates the clock signal (ICLK) as function of a global clock signal 115 (CLK) and a chip enable signal 117 (CEB), and generates address signals (TOP, BOT) as function of an address word 118 (ADR[N:0]) and the chip enable signal 117 (CEB).

In the illustrated embodiment, the memory array 302 includes a first (bottom) memory cell 312 and a second (top) memory cell 314. The sleep signal (SLP) from the global I/O system 306 is received in the local I/O system 304 as a first delayed sleep signal 316 (SLP_BOT_BL) and a second delayed sleep signal 319 (SLP_BOT_BLB) for the bottom memory cell 312 in the illustrated embodiment.

The local I/O system 304 includes logic circuitry for each of the memory cells in the memory array 302 that generate bit line pre-charge (BPCHB) signals for controlling power to the bit lines of the respective memory cells as a function of the sleep signal 301 (SLP) and clock (ICLK) and address (TOP, BOT) signals. The local I/O system 304 further includes a plurality of delay elements 307, 324, 334, 337, 344 that are connected in series within the sleep signal bit causing a delay between the sleep signal 301 (SLP) and logic circuitry for each of a plurality of memory cell bit lines 321, 325, 333, 335. The sleep signal 301 (SLP) is delayed prior to the first logic (OR) gate 322 of the bottom memory cell 312 by the first delay element 307. The output of the first delay element is the first delayed sleep signal 316 (SLP_BOT_BL). The delay elements are positioned along the wake up signal path. The delay elements 307, 324, 334, 337, 344 may, for example, be buffers that each include a series of an even number of inverters. The delay elements are connected in sequence with the sleep signal 301 (SLP) such that a transition of the sleep signal 301 (SLP) indicating a memory wake-up operation (e.g., coming out of shut-down, deep sleep, or light sleep) causes the plurality of memory cells in the memory array 302 to receive power in a sequential manner. The sleep signal (SLP) inputs into the first delay element 307 which generates the first delayed sleep signal 316 (SLP_BOT_BL). The first delayed sleep signal 316 (SLP_BOT_BL) inputs into the second delay element 324 which generates the second delayed sleep signal 319 (SLP_BOT_BLB). The second delayed sleep signal 319 (SLP_BOT_BLB) inputs into the third delay element 334 which generates a third delayed sleep signal 329 (SLP_TOP_BL). The third delayed sleep signal 329 (SLP_TOP_BL) inputs into the fourth delay element 337 which generates a fourth delayed sleep signal 339 (SLP_TOP_BLB). The fourth delayed sleep signal 339 (SLP_TOP_BLB) inputs into (SLP_TOP_BLB) inputs into the fifth delay element 344 which then outputs from the local I/O 304.

The clock (ICLK) and address (TOP, BOT) signals are input to the first logic (AND) gate 320 and a second logic (AND) gate 330. The first delayed sleep signal 316 (SLP_BOT_BL) is input to a first logic (OR) gate 322 for the bottom memory cell 312, along with the output of the first logic (AND) gate 320 clock (ICLK) and addressing (BOT) signal as a bit line pre charge signal 303 (BPCHB_BOT) for the bottom memory cell 312. The clock (ICLK) and address (TOP) signal are input to the second logic (AND) gate 330 which outputs the bit line pre charge signal (BPCHB_TOP) for the top memory cell 314.

The bit line pre charge signal 303 (BPCHB_BOT) for the bottom memory cell 312 is input into the first logic (OR) gate 322 and a second logic (OR) gate 327. The first logic (OR) gate 322 and the second logic (OR) gate 327 generate the bit line precharge signals (BPCHB_BOT_BL and BPCHB_BOT_BLB) for the bottom memory cell 312. Specifically, a bit line pre-charge signal 323 (BPCHB_BOT_BL) is received at the gate terminal of a first PMOS transistors 326, which include source terminals that are coupled to a supply voltage, and a drain terminal that is coupled to the bit line 321 (BL_BOT). A bit line bar pre-charge signal 331 (BPCHB_BOT_BLB) is received at the gate terminal of a second PMOS transistor 328, which include source terminals that are coupled to a supply voltage, and a drain terminals that is coupled to the bar bit line 325 (BLB_BOT). As described above, the bit line pre charge signal 303 (BPCHB_BOT) is configured such that during an operation associated with the bottom cell 312 the bit lines for bottom cell 321, 325 (BL_BOT and BLB_BOT) are pre-charged at essentially the same time.

A bit line pre charge signal 305 (BPCHB_TOP) for the top memory cell 314 is input into a first logic (OR) gate 332 and a second logic (OR) gate 342 for the top memory cell. The first logic (OR) gate 332 and the second logic (OR) gate 342 generate the bit line precharge signals (BPCHB_TOP_BL and BPCHB_TOP_BLB) for the top memory cell 314. Specifically, a bit line pre-charge signal 341 (BPCHB_TOP_BL) is received at the gate terminal of a first PMOS transistors 336, which include source terminals that are coupled to a supply voltage, and a drain terminal that is coupled to the bit line 333 (BL_TOP). A bit line bar pre-charge signal 343 (BPCHB_TOP_BLB) is received at the gate terminal of a second PMOS transistor 338, which include source terminals that are coupled to a supply voltage, and a drain terminals that is coupled to the bar bit line 335 (BLB_TOP). As described above, the bit line pre charge signal 305 (BPCHB_TOP) is configured such that during an operation associated with the top cell 314 the bit lines for the top cell 333, 335 (BL_TOP and BLB_TOP) are precharged at essentially the same time.

The clock (ICLK) and address (TOP, BOT) signals are input to the first logic (AND) gate 320. The first delayed sleep signal 316 (SLP_BOT_BL) is input to the first logic (OR) gate 322 for the bottom memory cell 312, along with the output of the first logic (AND) gate 320 clock (ICLK) and addressing (TOP, BOT) signals as the bit line pre charge signal 303 (BPCHB_BOT) for the bottom memory cell 312. More particularly, the logic circuit for the bottom memory cell 312 includes the first logic (AND) gate 320 with inputs that receive the addressing (BOT) signal and clock (ICLK) signals, and the first logic (OR) gate 322 with inputs that receive the output of the first logic (AND) gate 320 and the first delayed sleep signal 316 (SLP_BOT_BL). The output of the first logic (OR) gate 322 provides the bit line pre-charge signal 323 (BPCHB_BOT_BL) for switching circuitry memory cell. The output of the second logic (OR) gate 327 provides the bit line bar pre-charge signal 331 (BPCHB_BOT_BLB) for the bit line bar 325 of the bottom memory cell 312. Specifically, the bit line pre-charge signal 323 (BPCHB_BOT_BL) is received at the gate terminal of the first PMOS transistors 326, which include source terminals that are coupled to a supply voltage, and a drain terminal that is coupled to the bit line 321 (BL_BOT). The bit line bar pre-charge signal 331 (BPCHB_BOT_BLB) is received at the gate terminal of the second PMOS transistor 328, which include source terminals that are coupled to a supply voltage, and a drain terminals that is coupled to the bit line bar 325 (BLB_BOT).

In response to a transition of the first delayed sleep signal 316 (SLP_BOT_BL) indicating a memory wake-up operation, the first logic (OR) gate 322 for the bottom memory cell 312 generates a logic state on the bit line pre-charge signal 323 (BPCHB_BOT_BL) that causes power to be supplied to pre-charge the memory cell bit line 321 (BL_BOT). The sleep signal further passes through the delay element 324 which generates the second delayed sleep signal 319 (SLP_BOT_BLB). In response to a transition of the second delayed sleep signal 319 (SLP_BOT_BLB) indicating a memory wake-up operation, the second logic (OR) gate 327 for the bottom memory cell 312 generates a logic state on the bit line pre-charge signal for the bit line bar 331 (BPCHB_BOT_BLB) that causes power to be supplied to pre-charge memory cell bit line for the bit line bar 325 (BLB_BOT). More specifically, the first PMOS transistor 326 is controlled by the bit line pre-charge signal 323 (BPCHB_BOT_BL) to provide power to the memory cell 312 bit line 321 (BL_BOT). The second PMOS transistor 328 is controlled by the bit line pre-charge signal 331 (BPCHB_BOT_BLB) to provide power to the memory cell 312 bit line 325 (BLB_BOT) in order to initialize the bit line voltages as the memory array 302 is powered on in response to a memory wake-up operation (e.g., coming out of shut-down, deep sleep, or light sleep.) An example of this operation is illustrated in the timing diagram 400 shown in FIG. 4.

Figure 4:
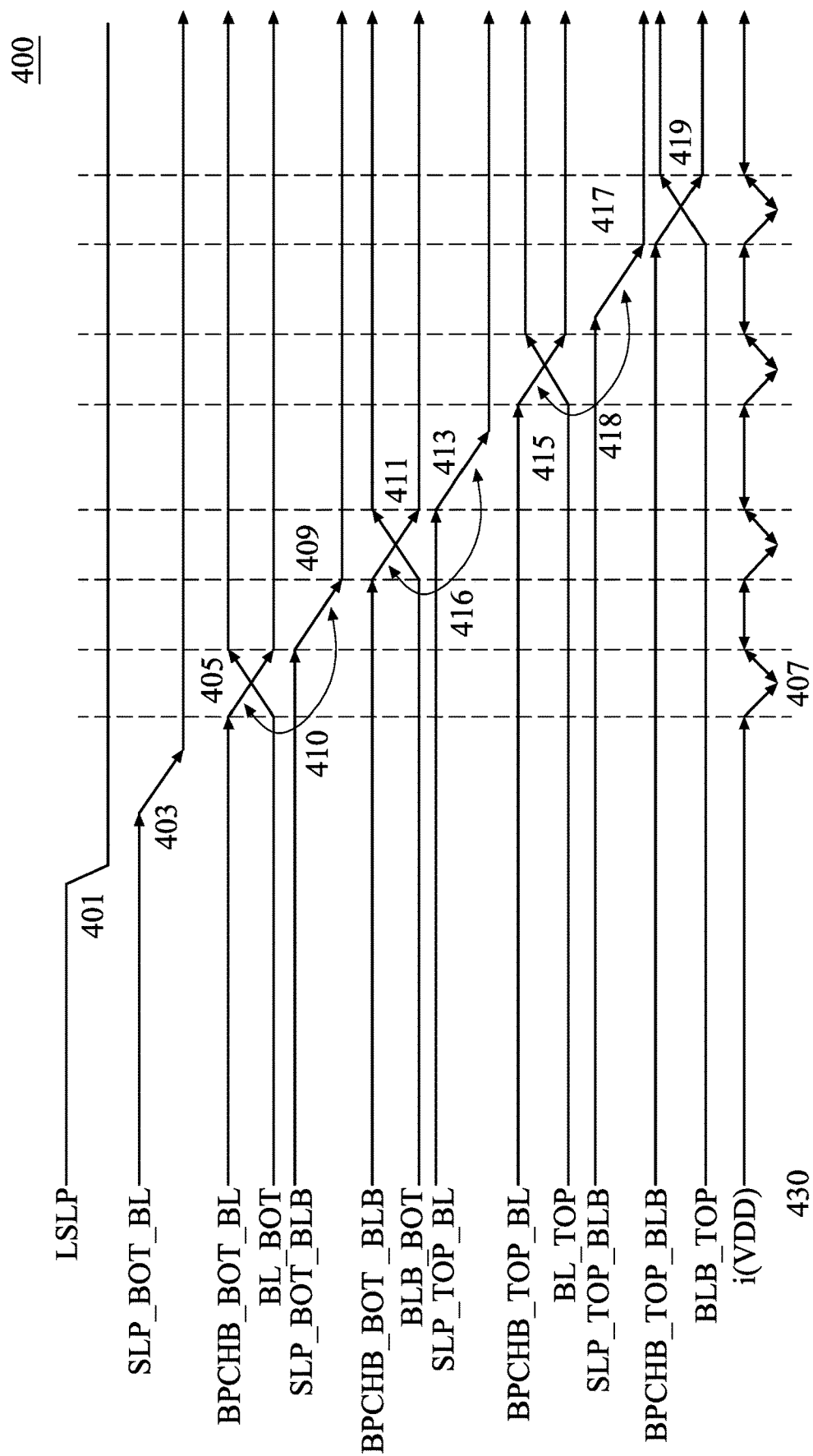
FIG. 4 is a timing diagram showing an example operation of the power management circuit of FIG. 3 in an embodiment.

FIG. 4 is the timing diagram 400 for the example power management circuit 300 for a semiconductor memory (e.g., SRAM) in accordance with an embodiment. With reference to FIG. 4, the wake-up operation is initiated by a logic high to logic low transition 401 in the sleep signal 113 (LSLP) received by the global I/O system 306. The logic state transition 401 of the sleep signal 113 (LSLP) causes a corresponding logic state transition 403 in the sleep signal 301 (SLP) received by the local I/O system 304. The initial sleep signal 301 (SLP) passes through a first delay element which generates the bit line first delayed sleep signal 316 (SLP_BOT_BL). As detailed above with reference to FIG. 3, the logic state transition 403 in the first delayed sleep signal 316 (SLP_BOT_BL) causes the first logic (OR) gate 322 for the bottom memory cell 312 to a high to low transition 405 of the logic state of the bit line pre-charge signal 323 (BPCHB_BOT_BL), which causes power to be supplied to pre-charge the memory cell bit line 321 (BL_BOT). The precharging of the memory cell bit line 321 (BL_BOT) can be seen in the timing diagram 400 of FIG. 4 by the voltage transition 405 that occurs in response to the logic state transition 405 of the bit line pre-charge signal 323 (BPCHB_BOT_BL). This generates a first peak in the wakeup current 407 i(VDD). This first peak of wakeup current 407 i(VDD) is less than the wakeup current in memory circuits that precharge bit lines at the same time by, for example, one fourth.

With reference again to FIG. 3, the first delayed sleep signal 316 (SLP_BOT_BL) is received by as input to the second delay element 324 and generates the second delayed sleep signal 319 (SLP_BOT_BLB). The second delayed sleep signal 319 (SLP_BOT_BLB) is received by the third delay element 334 and generates the third delayed sleep signal 329 (SLP_TOP_BL). The first logic circuitry (OR) gate 332 of the top memory cell 314 generates the bit line pre-charge signal 341 (BPCHB_TOP_BL), such that the logic state of the second delayed sleep signal does not transition (indicating a wake-up operation) until after the bit line voltages 321, 325 (BL_BOT and BLB_BOT) of the bottom memory cell 312 have been initialized.

As shown in the timing diagram 400 of FIG. 4, the second delayed sleep signal 319 (SLP_BOT_BLB) begins a logic state transition 409 only after the bit line pre-charge signal 323 (BPCHB_BOT_BL) has transitioned from logic high to logic low 405. This causes a time delay 410 between precharging of the bit line voltage 321 (BL_BOT) of the first PMOS transistor 326 and the initiation of wake-up for the complementary PMOS transistor 328 for the bit line voltage 325 (BLB_BOT) of the bottom memory cell 312.

With reference again to FIG. 3, the third delayed sleep signal 329 (SLP_TOP_BL) is provided as a sleep signal input to the logic circuits 330, 332 for the top memory cell 314 and also as an input to the fourth delay element 337. The logic circuit for the top memory cell 314 includes a first logic (AND) gate 330 with inputs that receive the addressing (TOP) signal and clock (ICLK), and the first logic (OR) gate 332 with inputs that receive the output of the first logic gate 330 and the third delayed sleep signal 329 (SLP_TOP_BL). The output of the first logic (AND) gate 330 for the top memory cell 314 is the bit line precharge bar 305 (BPCHB_TOP). The output of the first logic (OR) gate 332 provides the bit line pre-charge signal 341 (BPCHB_TOP_BL) for switching circuitry in the top memory cell 314. Specifically, the bit line pre-charge signal 341 (BPCHB_TOP_BL) is received at the gate terminal of the first PMOS transistors 336, which includes source terminal that is coupled to a supply voltage, and drain terminals is coupled to the bit line 333 (BL_TOP) input of the top memory cell 314. The output of the second logic (OR) gate 342 provides the bit line bar pre-charge signal 343 (BPCHB_TOP_BLB) for the top memory cell 314. The bit line bar pre-charge signal 343 (BPCHB_TOP_BLB) is received at the gate terminal of the second PMOS transistors 338, which includes source terminal that is coupled to a supply voltage, and drain terminals is coupled to the bit line bar 335 (BLB_TOP) input of the top memory cell 314.

In response to a transition of the third delayed sleep signal 329 (SLP_TOP_BL) indicating a memory wake-up operation, the first logic (OR) gate 332 for the top memory cell 314 generates a logic state on the bit line pre-charge signal 341 (BPCHB_TOP_BL) that causes the first PMOS transistor 336 of the top memory cell 314 to supply power to pre-charge the memory cell bit line 333 (BL_TOP). Subsequently, in response to a transition of the fourth delayed sleep signal 339 (SLP_TOP_BLB) indicating a memory wake-up operation, the second logic (OR) gate 342 for the top memory cell 314 generates a logic state on the bit line pre-charge signal 343 (BPCHB_TOP_BLB) that causes the second PMOS transistor 338 to supply power to pre-charge the memory cell bit line bar 335 (BLB_TOP). As shown in the timing diagram of FIG. 4, a logic state transition 413 in the third delayed sleep signal 329 (SLP_TOP_BL) causes the first logic (OR) gate 332 for the top memory cell 314 to transition 415 the logic state of the bit line pre-charge signal 341 (BPCHB_TOP_BL), which causes power to be supplied to pre-charge memory cell bit line 333 (BL_TOP). As shown in the timing diagram of FIG. 4, the logic state transition 417 in the fourth delayed sleep signal 339 (SLP_TOP_BLB) causes the second logic (OR) gate 342 for the top memory cell 314 to transition 419 the logic state of the bit line bar pre-charge signal 343 (BPCHB_TOP_BLB), which causes power to be supplied to pre-charge memory cell bit line bar 335 (BLB_TOP). The precharging of memory cell bit lines 333, 335 (BL_TOP and BLB_TOP) can be seen in the timing diagram 400 of FIG. 4 by voltage transitions 411, 413 that occurs in response to the logic state transitions 415, 419 of the bit line pre-charge signals 341, 343 (BPCHB_TOP_BL and BPCHB_TOP_BLB) respectively.

With reference again to FIG. 3, the second delayed sleep signal 319 (SLP_BOT_BLB) is received as inputs to the third delay element 334, which generates the third delayed sleep signal 329 (SLP_TOP_BL). The generation of the third delayed sleep signal 329 (SLP_TOP_BL) by the third delay element 334 is delayed such that the logic state of the third delayed sleep signal 329 (SLP_TOP_BL) does not transition (indicating a wake-up operation) until after the bit line voltages 321, 325 (BL_BOT and BLB_BOT) of the bottom memory cell 312 have been initialized.

As shown in the timing diagram 400 of FIG. 4, the third delayed sleep signal 329 (SLP_TOP_BL) begins the high-to-low logic state transition 413 only after the bit line pre-charge signal 331 (BPCHB_BOT_BLB) has the transition 411 from logic high to logic low. This causes a time delay 416 between precharging of the bit line bar voltage 325 (BLB_BOT) of the bottom memory cell 312 and the initiation of wake-up operations for the first bit line 333 (BL_TOP) of the top memory cell 314.

As shown in the timing diagram 400 of FIG. 4, the fourth delayed sleep signal 339 (SLP_TOP_BLB) begins a high-to-low logic state transition 417 only after the bit line pre-charge signal 341 (BPCHB_TOP_BL) has transitioned 415 from logic high to logic low. This causes a time delay 418 between precharging of the bit line voltage 333 (BL_TOP) of the top memory cell 314 and the initiation of wake-up operations for the bit line bar 335 (BLB_TOP) of the top memory cell 314.

In this manner, the bit lines of the two memory cells 312, 314 in the example embodiment 300 are pre-charged in a sequential fashion, as illustrated in the example timing diagram 400 shown in FIG. 4. Specifically, each bit line pre-charge signal 323, 331, 341, 343 is received at the gate terminals of the four PMOS transistors 326, 328, 336, 338 sequentially. As further shown in FIG. 4, the sequential wake-up operation causes the resulting wake-up current draw 430 to occur during four separate intervals, reducing the peak wakeup current in comparison to systems that perform simultaneous wake-up operations on multiple memory cells.

Figures 5A, 5B:
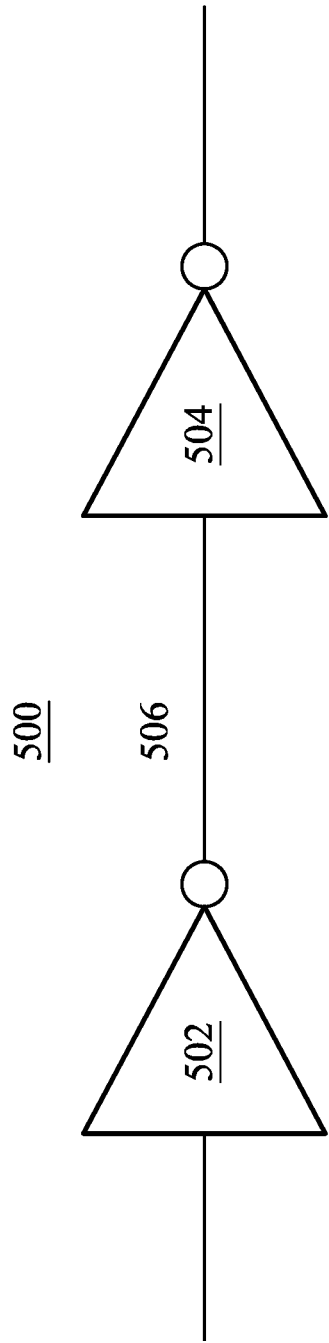
FIGS. 5A-5B depict an example of a delay element and associated logic table that may, for example, be utilized as one or more of the delay elements in FIG. 3 in an embodiment.

FIGS. 5A-5B depict an example of a buffer 500 that may, for example, be utilized as one or more of the delay elements 307, 324, 334, 337, 344 in FIG. 3 in accordance with an embodiment. As shown in FIG. 5A, the buffer 500 includes a pair of inverters 502, 504. A first inverter 502 has an output 506 that is the input of the second inverter 504. The output 506 of the first inverter 502 is inverse to the input such that if the input is logic high state then the output is logic low state. A sleep signal (e.g., SLP_BOT_BL) is the input to the first inverter 502 and the output 506 of the first inverter 502 is the input for the second inverter 504. The output of the second inverter 504 provides a delayed sleep signal (e.g., SLP_BOT_BLB) that matches the logic state of the input sleep signal.

A logic state table 510 for the example delay element is shown at FIG. 5B. As shown in table 510, when the first sleep signal (e.g., SLP_BOT_BL) is in a logic low state, the delayed sleep signal (e.g., SLP_BOT_BLB) will also be in a logic low state. As detailed above with reference to FIG. 4, when the first sleep signal (e.g., SLP_BOT_BL) is in a logic high state the delayed sleep signal (e.g., SLP_BOT_BLB) will be logic state high.

Figure 6:
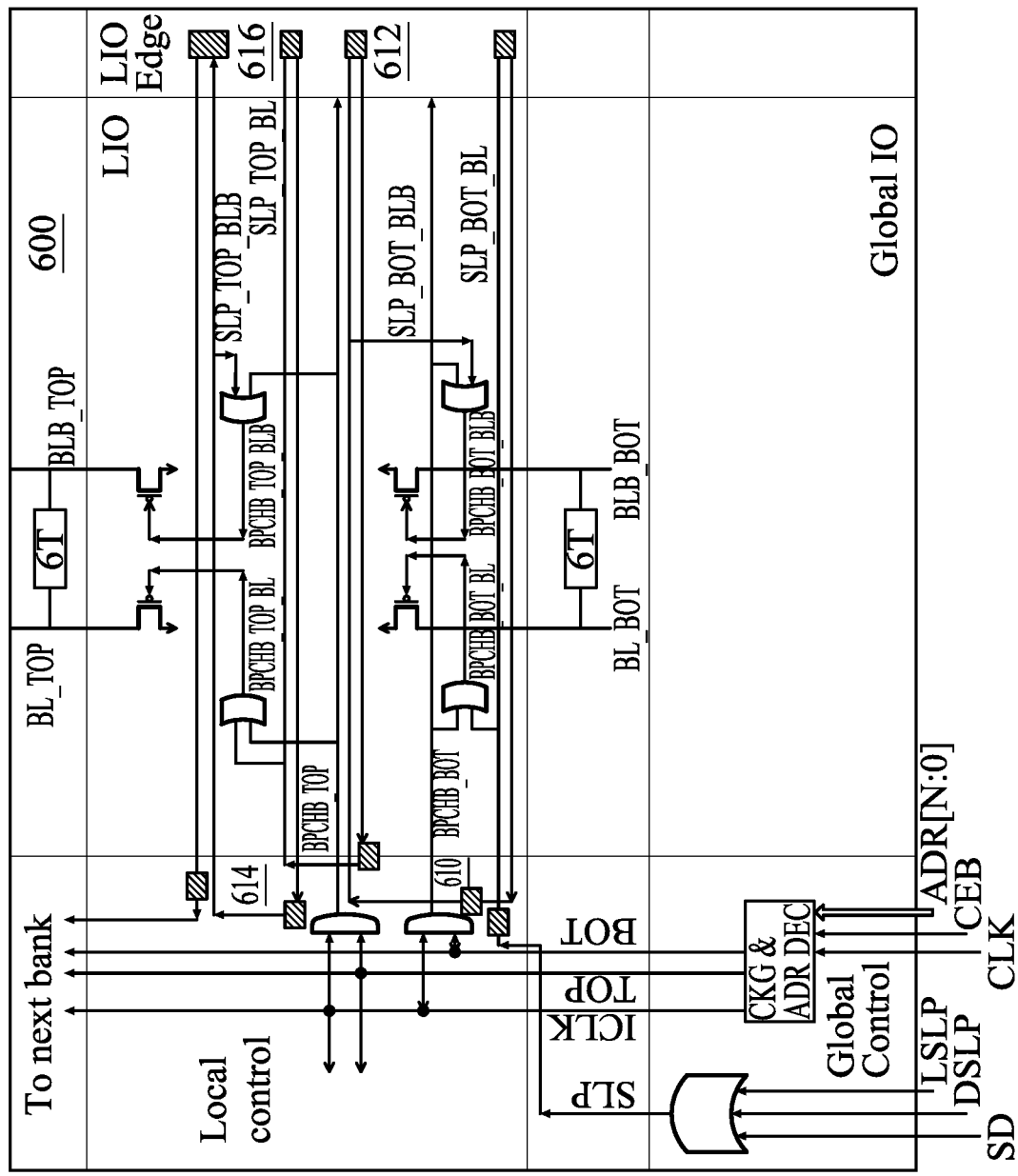
FIG. 6 is a diagram of another example power management circuit for a semiconductor memory (e.g., SRAM) in an embodiment.

FIG. 6 is a diagram of another example power management circuit 600 for a semiconductor memory (e.g., SRAM) in accordance with an embodiment. The example 600 shown in FIG. 6 is the same as the example power management circuit 300 shown in FIG. 3, except that the example 600 shown in FIG. 6 utilizes additional delay elements 610, 612, 614 between the sleep signals 316, 319, 329 and subsequent delayed sleep signals 319, 329, 339. The fourth additional delay element 616 is connected in series between the fourth delayed sleep signal 339 (SLP_TOP_BLB) the bit line sleep signal output from the local I/O 304. The delay elements 610, 612, 614, 616 may, for example, be buffers that each include a series of an even number of inverters. The length of the signal delay caused by each delay element 610, 612, 614, 616 may, for example, be determined by the number of inverter pairs included in the buffer circuit. Multiple delay elements may be connected in series with delay elements located on the edge of the local I/O 304. Additional delay elements may, for example, provide additional delay in the bit line tracking for pre charge when line resistance is high.

When a memory wake-up operation is initiated by one or more of the SD 109, DSLP 111, and LSLP 113 signals received by the global I/O system 306, the bit line 321 (BL_BOT) is precharged and then the second delayed sleep signal 319 (SLP_BOT_BLB) is generated by the second delay element which precharges the bit line bar 325 (BLB_BOT). Once the bottom memory cell 312 is precharged, the third delayed sleep signal 329 (SLP_TOP_BL) is generated by third delay element 334 in the same way as described above with reference to the embodiment shown in FIG. 3. The third delayed sleep signal 329 (SLP_TOP_BL) also causes the first bit line of the top memory cell 333 (BL_TOP) to be precharged and then inputs into the fourth delay element 337 and sequentially pre-charges the second bit line of the top memory cell 335 (BLB_TOP), as describe above with reference to FIG. 3. However, the subsequent delayed sleep signals 319, 329, and 339 (SLP_BOT_BLB, SLP_TOP_BL, and SLP_TOP_BLB) in this embodiment 600 are respectively generated by the delay elements 610, 612, and 614. In this way, initiation of the memory wake-up operation for the bottom memory cell second bit line 325 is delayed by an amount of time (D1) from initiation of the memory wake-up operation of the bottom memory cell first bit line 321, and the top memory cell first bit line 333 (BL_TOP) is delayed by an amount of time (D2) from initiation of the memory wake-up operation for the bottom memory cell second bit line 325, and initiation of the memory wake-up operation for the top memory cell second bit line 335 is delayed by an amount of time (D3) from initiation of the memory wake-up operation for the top memory cell first bit line 333 (BL_TOP). The length of the time delays (D1, D2, and D3) may be determined by the size of the respective delay elements, 324 and 610 for D1, 334 and 612 for D2, and 337 and 614 for D3 (e.g., by selecting the number of inverter pairs), and may be configured such that the bit lines 321, 325, 333, 335 of the memory cells 312, 314 are pre-charged in a sequential fashion, similar to (or the same as) the sequential bit line precharging that results from the embodiment of FIG. 3. In this way, a sequential bit line pre-charge operation within a memory bank may be achieved. Consequentially, wake-up peak current may be significantly reduced (e.g., by one fourth) in comparison to existing SRAM architectures.

Figure 7:
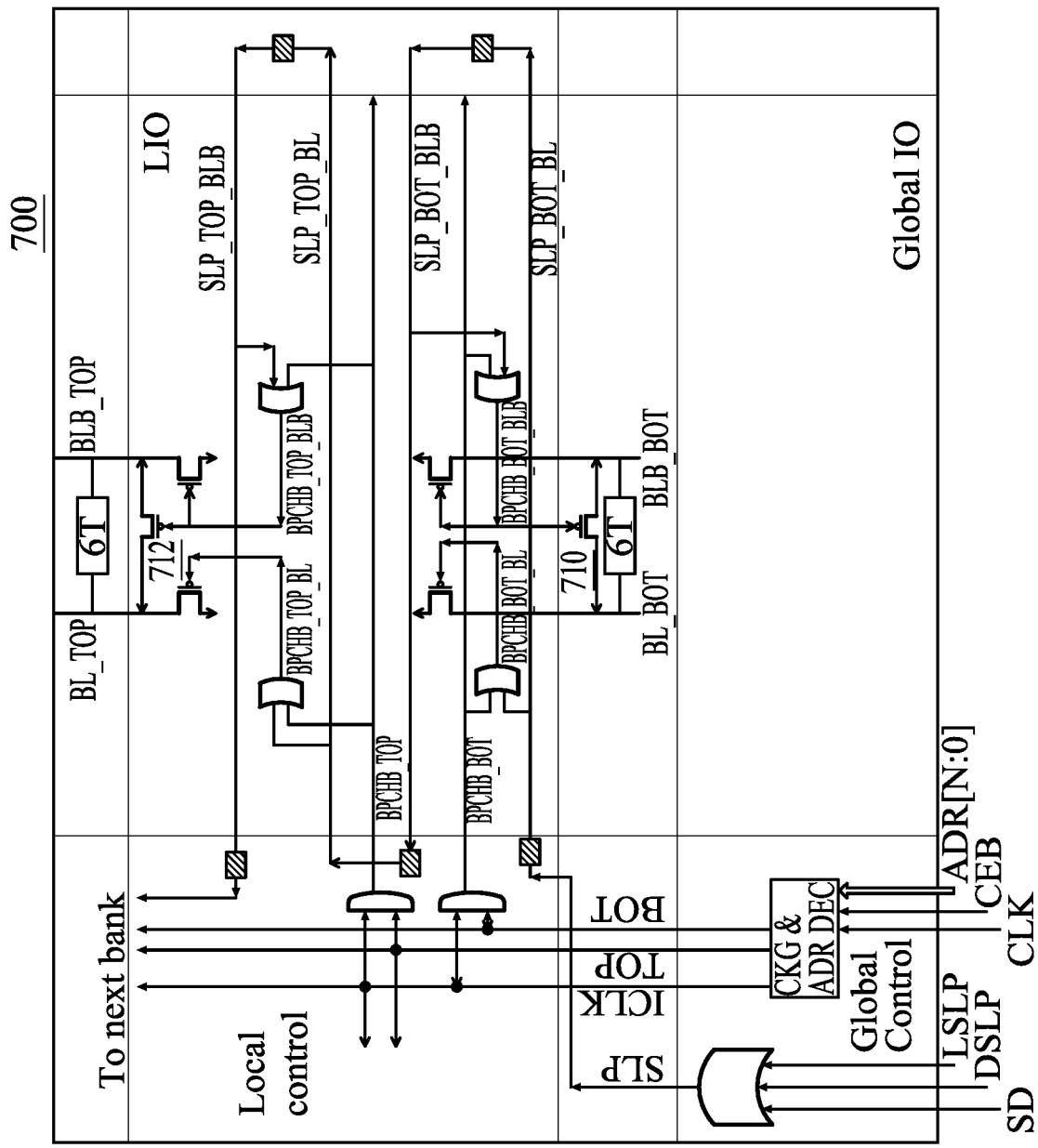
FIG. 7 is a further example of a power management circuit for a semiconductor memory (e.g., SRAM) in an embodiment.

FIG. 7 is a further example of a power management circuit 700 for a semiconductor memory (e.g., SRAM) in accordance with an embodiment. The example 700 shown in FIG. 7 is the same as the example power management circuit 300 shown in FIG. 3, except that in the example 700 shown in FIG. 7 the memory cells respectively include equalizer devices 710, 712 between bit lines 321, 325 (BL_BOT and BLB_BOT) and bit lines 333, 335 (BL_TOP and BLB_TOP) respectively. The equalizer device may, for example, comprise a PMOS transistor. The equalizer device 710 for the bottom memory cell 312 receives the bit line pre-charge signal 331 (BPCHB_BOT_BLB) at the gate terminal of the PMOS transistor, which includes a source terminal that is coupled to a bit line and a drain terminal that is coupled to the complementary bit line. The bit line pre-charge signal 331 (BPCHB_BOT_BLB) that is received by the gate terminal results from the second logic (OR) gate 327 with inputs from the second delayed sleep signal 319 (SLP_BOT_BLB) and the bit line pre-charge signal 303 (BPCHB_BOT). As shown in the timing diagram 400 of FIG. 4, the second delayed sleep signal 319 (SLP_BOT_BLB) begins the logic state transition 409 only after the bit line pre-charge signal 323 (BPCHB_BOT_BL) has transitioned from logic high to logic low. This causes a time delay 410 between precharging of the bit line voltage 321 (BL_BOT) of the first PMOS transistor 326 and the initiation of wake-up for the complementary PMOS transistor 328 for the bit line voltage 325 (BLB_BOT) of the bottom memory cell 312. The additional equalizer device, when (BPCHB_BOT_BLB) transitioned from logic high to logic low during initiation of wake-up, equalizes the complementary bit lines 321, 325 (BL_BOT and BLB_BOT) such that the voltage on the source terminals of the first PMOS transistor 326 and second PMOS transistor 328 of the bottom memory cell 312 is essentially the same.

The equalizer device 712 for the top memory cell 314 receives the bit line pre-charge signal 343 (BPCHB_TOP_BLB) at the gate terminal of the PMOS transistor, which includes a source terminal that is coupled to a bit line and a drain terminal that is coupled to the complementary bit line 333, 335 (BL_TOP and BLB_TOP). The bit line pre-charge signal 343 (BPCHB_TOP_BLB) is received by the gate terminal which results from the second logic (OR) gate 342 with inputs from the fourth delayed sleep signal 339 (SLP_TOP_BLB) and the bit line precharge signal 305 (BPCHB_TOP). As shown in the timing diagram 400 of FIG. 4, fourth delayed sleep signal 339 (SLP_TOP_BLB) begins the logic state transition 417 only after the bit line pre-charge signal 341 (BPCHB_TOP_BL) has transitioned from logic high to logic low. This causes a time delay between precharging of the bit line voltage 333 (BL_TOP) of the first PMOS transistor 336 and the initiation of wake-up for the complementary PMOS transistor 338 for the bit line voltage 335 (BLB_TOP) of the top memory cell 314. The additional equalizer device, when the bit line pre-charge signal 343 (BPCHB_TOP_BLB) transitioned from logic high to logic low during initiation of wake-up, equalizes the complementary bit lines 333, 335 (BL_TOP and BLB_TOP) such that the voltages on the source terminals of the first PMOS transistor 336 and second PMOS transistor 338 of the top memory cell 314 are essentially the same.

Figure 8:
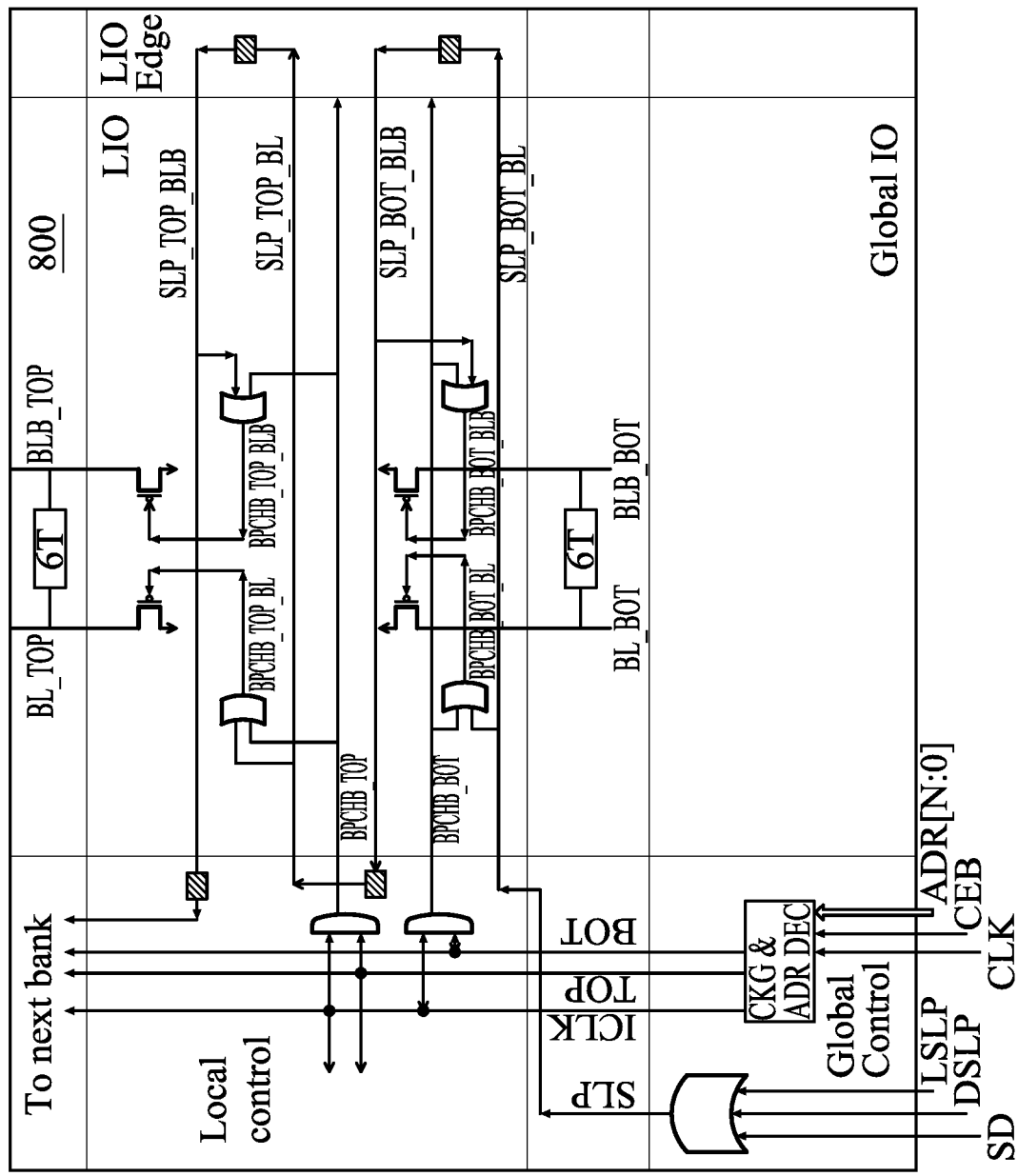
FIG. 8 is an additional example of a power management circuit for a semiconductor memory (e.g., SRAM) in an embodiment.

FIG. 8 is a diagram of an additional example of a power management circuit 800 for a semiconductor memory (e.g., SRAM) in accordance with an embodiment. The example 800 shown in FIG. 8 is the same as the example power management circuit 300 shown in FIG. 3, except that the example 800 shown in FIG. 8 does not utilize a delay element between the sleep signal 301 (SLP) and the first logic (OR) gate 322. In this embodiment there is no delay element connected in series between the sleep signal 301 (SLP) and the sleep signal 316 (SLP_BOT_BL) for the first bit line 321 of the bottom memory cell 312.

Figure 9:
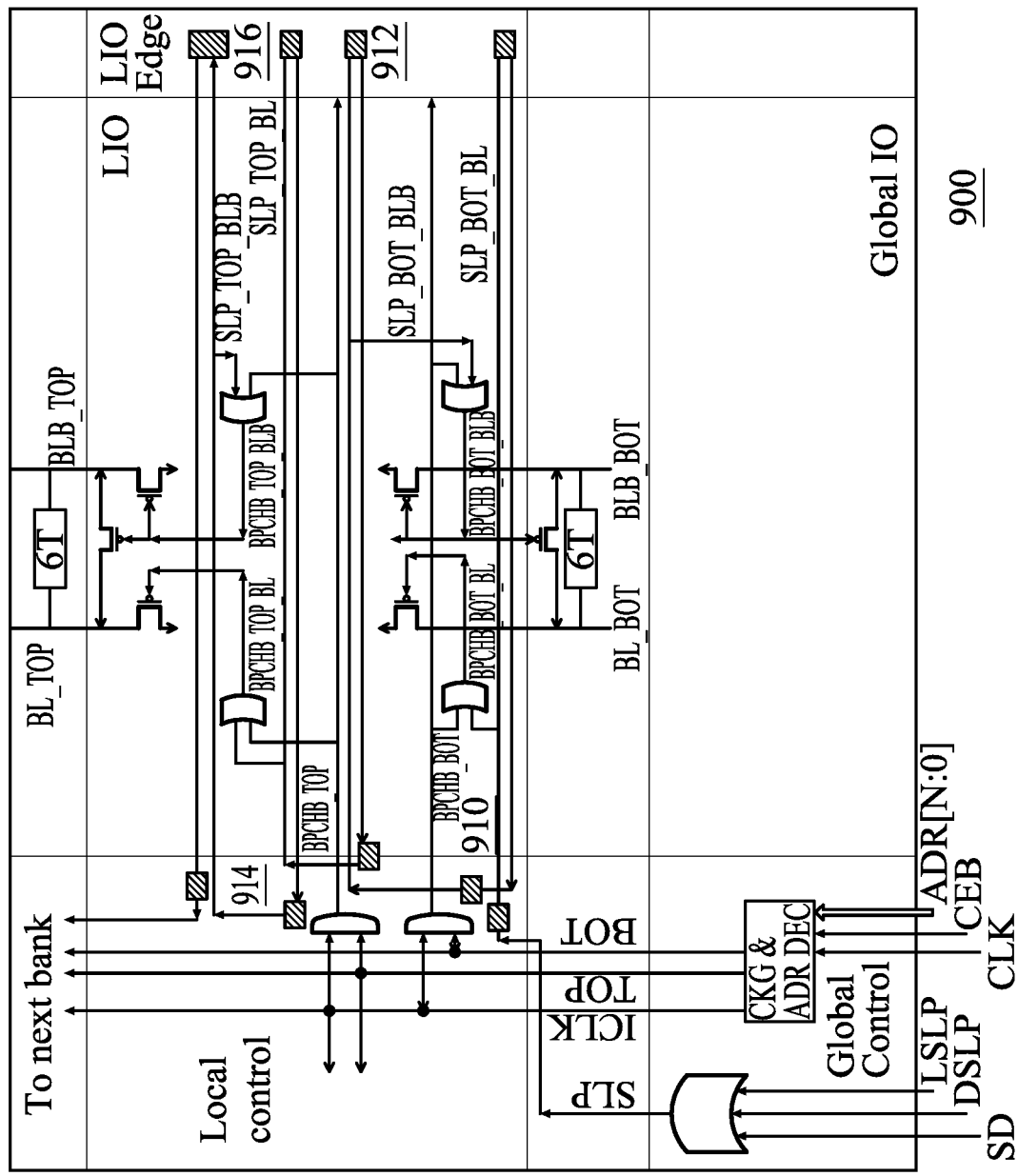
FIG. 9 is another example of a power management circuit for a semiconductor memory (e.g., SRAM) in an embodiment.

FIG. 9 is a diagram of another example of a power management circuit 900 for a semiconductor memory (e.g., SRAM) in accordance with an embodiment. The example 900 shown in FIG. 9 is the same as the example power management circuit 700 shown in FIG. 7, except that the example 900 shown in FIG. 9 includes additional equalizer delay elements 910, 912, 914, 916 between sleep signals 316, 319, and 329 and delayed sleep signals 319, 329, 339. The fourth additional delay element 916 is connected in series between the fourth delayed sleep signal 339 (SLP_TOP_BLB) the bit line sleep signal output from the local I/O 304. The delay elements 910, 912, 914, 916 may, for example, be buffers that each include a series of an even number of inverters. The length of the signal delay caused by each delay element 910, 912, 914, 916 may, for example, be determined by the number of inverter pairs included in the buffer circuit. Multiple delay elements may be connected in series with delay elements located on the edge of the local I/O 304. Additional delay elements may, for example, provide additional delay in the bit line tracking for pre charge when line resistance is high.

FIG. 10A is a flow diagram depicting a method 1000 for controlling wake-up operations for a memory array that includes a plurality of memory cells. The steps of FIG. 10A are provided with reference to previously described structures for ease of understanding, but it is understood that the steps could be performed using a variety of structures. The method 1000 may, for example, be performed by one of the example memory circuits 300, 600, 700, 800, 900 shown in FIGS. 3, 6, 7, 8, and 9. The sleep signal 301 (SLP) is received by the memory circuit at 1001 indicating initiation of a memory wake-up operation. The sleep signal may, for example, be received by the logic circuitry 322, 327, 332, 342 in FIGS. 3, 6, 7, 8, and 9. A first bit line pre-charge signal (e.g., BPCHB_BOT_BL) for a first memory cell of the plurality of memory cells is generated in response to the sleep signal. The first bit line pre-charge signal may, for example, be generated by the logic circuitry 308 shown in FIGS. 3, 6, 7, 8, and 9. At 1010, a bit line of the first memory cell, such as bit line 321 shown in FIGS. 3, 6, 7, 8, and 9, is pre-charged in response to the first bit line pre-charge signal. A delayed sleep signal (e.g., SLP_BOT_BLB) is generated in response to the sleep signal passing through a delay element 1015 such as 324 in series along the bit line. A second bit line pre-charge signal (e.g., BPCHB_BOT_BLB) for the first memory cell of the plurality of memory cells is generated in response to the sleep signal. At 1020, a second bit line for the first memory cell, such as bit line 325 shown in FIG. 3, 6, 7, 8, or 9 is precharged in response to the second bit line pre-charge signal. The delayed sleep signal passes through a further delay element at 1025, again delaying the signal such and generating a second delayed sleep signal. A third bit line pre-charge signal is generated for a second memory cell of the plurality of memory cells in response to the second delayed sleep signal. The third bit line pre-charge signal may, for example, be generated by the logic circuitry 332 shown in FIG. 3, 6, 7, 8, or 9. At 1030, a bit line of the second memory cell, such as bit line 333 shown in FIG. 3, 6, 7, 8, or 9 is pre-charged in response to the third bit line pre-charge signal. The second delayed sleep signal passes through a third delay element at 1035, again delaying the signal and generating a third delayed sleep signal. A fourth bit line pre-charge signal is generated for a second bit line in a second memory cell of the plurality of memory cells in response to the third delayed sleep signal. At 1040, the second bit line of the second memory cell, such as bit line 335 shown in FIG. 1, 4, 5, 6, or 7 is pre-charged in response to the fourth bit line pre-charge signal.

FIG. 10B is a flow diagram of an example method 1000 for precharging bit cells during an operation associated with a memory cell in a memory array that includes a plurality of memory cells. The steps of FIG. 10B are provided with reference to previously described structures for ease of understanding, but it is understood that the steps could be performed using a variety of structures. The method 1000 may, for example, be performed by one of the example memory circuits 300, 600, 700, 800, 900 shown in FIGS. 3, 6, 7, 8 and 9. At 1002, an operation signal is received from the clock generator and address decoder 310, the logic circuitry 320, 330 for each of the memory cells 312, 314 generates the bit line pre-charge signal 303 (BPCHB_BOT) for the bottom memory cell 312 or 305 (BPCHB_TOP) for the top memory cell 314. For an operation signal associated with the bottom memory cell 312, the bit line pre-charge signal 303 (BPCHB_BOT) is received by the logic (OR) gates 322, 327 at the same time. At 1050, the bit line pre-charge signals 323, 331 (BPCHB_BOT_BL and BPCHB_BOT_BLB) pre charge the respective bit lines 321, 325 (BL_BOT and BLB_BOT) at the same time. For an operation signal associated with the top memory cell 314, the bit line pre-charge signal 305 (BPCHB_TOP) is received by the logic (OR) gates 332, 342 at the same time. At 1050, the bit line pre-charge signals 341, 343 (BPCHB_TOP_BL and BPCHB_TOP_BLB) precharge the respective bit lines 333, 335 (BL_TOP and BLB_TOP) at the same time.

In an example method, one of two bit lines associated with a bit cell is at a high logic level and the complementary bit line is in a low logic level based on a prior operation. The global I/O 306 signals that the associated bit cell is the target of a next operation (e.g., a read or write operation), a precharge circuit precharges both bit lines to the high level (e.g., bringing the low level line high and restoring any small drop in the high level line to restore it to a proper high level). Specifically the clock generator and address decoder 310 inputs to logic circuitry which generates a bit line pre charge signal associated with a memory cell 1002. The precharge circuit precharges both bit lines to the high level 1050.

When a memory wake-up operation is initiated by one or more of the SD 109, DSLP 111, and LSLP 113 signals received by the global I/O system, the bit lines 321, 325 (BL_BOT and BLB_BOT) for the bottom memory cell 312 are pre-charged, and the third delayed sleep signal 329 is generated by the third delay element 334 as described above with reference to the embodiment described above with reference to FIG. 3. The third delayed sleep signal 329 also causes the bit lines 333, 335 (BL_TOP and BLB_TOP) to be pre-charged in the same way as describe above with reference to FIG. 1. In this way, initiation of the memory wake-up operation for the bottom memory cell second bit line 325 (BLB_BOT) is delayed by an amount of time (D1) from initiation of the memory wake-up operation of the bottom memory cell first bit line 321 (BL_BOT), and initiation of the memory wake-up operation for the top memory cell first bit line 333 (BL_TOP) is delayed by an amount of time (D2) from initiation of the memory wake-up operation for the bottom memory cell second bit line 325 (BLB_BOT), and initiation of the memory wake-up operation for the top memory cell second bit line 335 (BLB_TOP) is delayed by an amount of time (D3) from initiation of the memory wake-up operation for the top memory cell first bit line 333 (BL_TOP). The length of the time delays (D1, D2, and D3) may be determined by the size of the respective delay elements 324, 334, and 337 (e.g., by selecting the number of inverter pairs), and may be configured such that the bit lines 321, 325, 333, 335 of the memory cells 312, 314 are pre-charged in a sequential fashion, similar to (or the same as) the sequential bit line precharging that results from the embodiment of FIG. 3.

Figure 11:
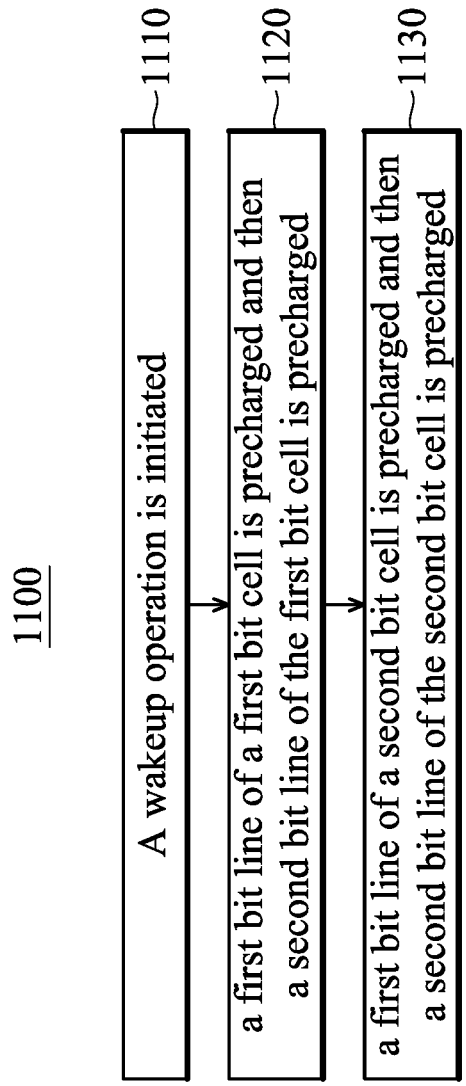
FIG. 11 is a flow diagram of an example method for controlling a wake-up operation for a memory array in an embodiment.

FIG. 11 is a flow diagram depicting a method 1100 for controlling wake-up operations for a memory array that includes a plurality of memory cells. The steps of FIG. 11 are provided with reference to previously described structures for ease of understanding, but it is understood that the steps could be performed using a variety of structures. A wakeup operation is initiated at the memory input (e.g., SD, LSLP, DSLP) at 1110. A sleep signal is propagated along a wake-up signal path to precharge a plurality of bit cells. The sleep signal precharges a first bit line of a first bit cell and then a second bit line of the first bit cell 1120. There is a delay between the precharge of the first bit line and the second bitline. The delayed sleep signal (e.g., SLP_TOP_BL) next precharges a first bit line of a second bit cell and then a second bit line of the second bit cell 1130. The delay elements (for example delay elements 307, 324, 334, 337, 344 in FIG. 3) cause each bit line to precharge at a different phase. In this method bit lines are not precharged simultaneously and peak in-rush current is reduced.

According to some embodiments, systems and methods are provided for a bit cell precharge circuit. In an example, the precharge circuit includes operational circuitry and wakeup precharge circuitry. The operational circuitry is configured such that a first bit line and a second bit line of a memory cell operate simultaneously. The wakeup precharge circuitry is configured to sequentially precharge the first bit line of a first bit cell and the second bit line of the first bit cell. In this example, the first bit line and the second bit line are each precharged through a bit line precharge signal. The bit line precharge signals having different phases because the signal is delayed between the precharging of the first bit line and the second bit line of the first bit cell. The wakeup circuitry may further precharge a first bit line of a second bit cell, and a second bit line of the second bit cell sequentially. The circuitry may, for example, precharge sequentially by positioning delay elements along the wake up signal path. In one example, the wake up signal path is configured to begin precharging the next bit line on the wake up signal path as soon as the prior bit line on the wake up signal path finishes precharging to maximize the speed of the wakeup operation while limiting peak power. In another example, the signal path is configured with additional delay elements along the wake up signal path such that additional delay occurs between the precharge of each bit line.

In an embodiment, a precharge circuit may precharge bit cells through an operational mode or a wake-up mode. The method of precharging bit lines of the bit cells results in staggering the precharging of bit lines during wake-up mode and precharging bit lines at the same time during operational mode. During operational mode, memory cells are precharged for an operation (for example a R/W operation) associated with the addressed memory cells. During operational mode, a control may precharge both bit lines of the memory cell at the same time to reduce wake-up time. The wake-up operation for a memory array may include precharging each bit line sequentially by charging one bit line, a delay occurring, and then charging a second complementary bit line of the bit cell. The time of the delay may be determined by the number of buffers, such as inverter pairs. The wake-up signal then charges the first bit line of a second memory cell, a delay occurs, and then charges a second complementary bit line of the second memory cell. The method of staggering precharging of the bit lines during wake-up operation may limit peak power consumption. This may prevent high peak power draw, reducing power for memory circuits with current maximums or permit other memory circuit components to draw power in constrained devices.

In an additional embodiment, a memory circuit includes a memory array with a plurality of memory cells, first logic circuitry, delay elements, and second logic circuitry. The first logic circuitry may be configured to generate a first bit line pre-charge signal for the first memory cell, where the first bit line pre-charge signal is generated in response to a sleep signal. The first bit line pre-charge signal is configured to charge a first bit line and then have the sleep signal propagate through a delay element which generates a delayed sleep signal. The delayed sleep signal then charges the second complementary bit line. The second logic circuitry may be configured to generate a second bit line pre-charge signal for a second memory cell, where the second bit line pre-charge signal is generated in response to the delayed sleep signal. The second logic circuitry may be configured to provide power to one or more bit lines of the second memory cell in response to the second bit line pre-charge signal. The second logic circuitry may be configured to provide power to a first bit line and then to a second complementary bit line of the second memory cell in response to a delayed pre-charge signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A bit cell precharge circuit comprising:
   wakeup precharge circuitry configured to precharge a first bit line of a first bit cell and a second bit line of the first bit cell, wherein the wakeup precharge circuitry includes:
      a wakeup signal path that includes a delay element between the first bit line and the second bit line.

2. The circuit of claim 1, wherein the wakeup signal path further includes a second delay element between a first bit line of a second bit cell and a second bit line of the second bit cell.

3. The circuit of claim 1, wherein the delay element includes a pair of inverters.

4. The circuit of claim 1, wherein the wakeup precharge circuitry further includes an equalizer element configured to connect the first bit line and the second bit line.

5. The circuit of claim 2, wherein the wakeup precharge circuitry is configured to cause a logic state transition in a delayed sleep signal to occur after power has been provided to the first bit line.

6. The circuit of claim 1, wherein a time between precharging of the first bit line and the second bit line is based on a delay associated with the delay element.

7. A bit line precharge circuit comprising:
   a first bit line of a first bit cell configured to receive a first precharge signal; and
   a second bit line of the first bit cell configured to receive a second precharge signal, wherein the second precharge signal is generated by delaying the first precharge signal.

8. The circuit of claim 7, further comprising:
   a first bit line of a second bit cell configured to receive a third precharge signal; and
   a second bit line of the second bit cell configured to receive a fourth precharge signal, wherein the third precharge signal and the fourth pre-charged signal have different phases.

9. The circuit of claim 8, wherein the first precharge signal, the second precharge signal, the third precharge signal, and the fourth precharge signal have different phases.

10. The circuit of claim 7, further comprising an equalizer device between the first bit line and the second bit line.

11. The circuit of claim 8, further comprising:
a first equalizer device between the first and second bit lines of the first bit cell; and
a second equalizer device between the first and second bit lines of the second bit cell.

12. The circuit of claim 7, further comprising a wake up signal path that includes a delay element.

13. The circuit of claim 12, wherein the delay element includes a pair of inverters.

14. A method of precharging bit cells, comprising:
during a wakeup operation:
generating, at a first delay element, a first delayed sleep signal from a sleep signal; and
precharging a first bit line of a first bit cell with the sleep signal and precharging a second bit line of the first bit cell with the first delayed sleep signal.

15. The method of claim 14, wherein the wakeup operation further includes:
generating, at a second delay element, a second delayed sleep signal; and
generating, at a third delay element, a third delayed sleep signal.

16. The method of claim 15, wherein the first delayed sleep signal, the second delayed sleep signal, and the third delayed sleep signal are generated sequentially.

17. The method of claim 15, wherein the second delayed sleep signal and the third delayed sleep signal precharge a first bit line of a second bit cell and a second bit line of the second bit cell, respectively.

18. The method of claim 14, wherein the first delay element includes a pair of inverters.

19. The method of claim 14, further comprising, during the wakeup operation, equalizing voltages on the first and second bit lines.

20. The method of claim 19, further comprising equalizing voltages on a first bit line of a second bit cell and a second bit line of the second bit cell.

* * * * *